US011715598B2

(12) United States Patent
Yeon et al.

(10) Patent No.: US 11,715,598 B2
(45) Date of Patent: Aug. 1, 2023

(54) MULTILAYER CAPACITOR AND BOARD HAVING THE SAME

(71) Applicant: SAMSUNG ELECTRO-MECHANICS CO., LTD., Suwon-si (KR)

(72) Inventors: Je Sik Yeon, Suwon-si (KR); Sun Hwa Kim, Suwon-si (KR); Eun Jin Shim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/313,300

(22) Filed: May 6, 2021

(65) Prior Publication Data

US 2022/0139617 A1    May 5, 2022

(30) Foreign Application Priority Data

Nov. 3, 2020   (KR) .......................... 10-2020-0145366

(51) Int. Cl.
*H01G 4/012* (2006.01)
*H01G 4/12* (2006.01)
*H01G 4/30* (2006.01)
*H01G 2/06* (2006.01)
*H05K 1/11* (2006.01)

(52) U.S. Cl.
CPC ............ *H01G 4/012* (2013.01); *H01G 2/065* (2013.01); *H01G 4/12* (2013.01); *H01G 4/30* (2013.01); *H05K 1/111* (2013.01)

(58) Field of Classification Search
CPC .......... H01G 4/005; H01G 4/30; H01G 4/012; H01G 2/065; H01G 4/12; H05K 1/111
USPC ............ 361/301.4, 321.1, 303, 321.3, 306.3
See application file for complete search history.

(56) References Cited

U.S. PATENT DOCUMENTS 9,214,283 B2 * 12/2015 Togashi .................. H01G 4/012
10,115,528 B2 * 10/2018 Abe ........................ H01G 4/224
2010/0214720 A1 *  8/2010 Pecina ..................... H01G 4/012
                                                            361/679.01

(Continued)

FOREIGN PATENT DOCUMENTS

KR   10-2013-0101319 A    9/2013
KR   10-2014-0142848 A   12/2014
KR        10-1832611 B1    2/2018

*Primary Examiner* — Arun Ramaswamy
(74) *Attorney, Agent, or Firm* — Morgan, Lewis & Bockius LLP

(57) ABSTRACT

A multilayer capacitor includes: a capacitor body including dielectric layers and first and second internal electrode layers and having first to sixth surfaces; and first and second external electrodes disposed on the third and fourth surfaces of the capacitor body, respectively. The first internal electrode layer is divided into a 1-1-th internal electrode connected to the first external electrode and a 1-2-th internal electrode by a first space portion disposed at a position close to the sixth surface, and the second internal electrode layer is divided into a 2-1-th internal electrode connected to the second external electrode and a 2-2-th internal electrode by a second space portion disposed at a position close to the fifth surface, such that the fifth and sixth surfaces of the capacitor body are in an electrically opened state.

7 Claims, 8 Drawing Sheets

(56) References Cited

U.S. PATENT DOCUMENTS

| | | | |
|---|---|---|---|
| 2013/0229749 A1* | 9/2013 | Lee | H01G 4/30 |
| | | | 156/89.12 |
| 2014/0362492 A1 | 12/2014 | Lee et al. | |
| 2015/0021073 A1* | 1/2015 | Kim | H01G 4/12 |
| | | | 174/258 |
| 2015/0170843 A1* | 6/2015 | Kim | H01G 4/012 |
| | | | 361/301.4 |
| 2015/0255213 A1* | 9/2015 | Lee | H01G 4/005 |
| | | | 174/258 |
| 2016/0027584 A1* | 1/2016 | Hattori | H01G 4/224 |
| | | | 361/301.4 |
| 2017/0367186 A1 | 12/2017 | Park et al. | |
| 2019/0096584 A1* | 3/2019 | Hong | H01G 4/30 |

\* cited by examiner

II-II'

III-III'

MULTILAYER CAPACITOR AND BOARD HAVING THE SAME

CROSS-REFERENCE TO RELATED APPLICATION(S)

This application claims benefit of priority to Korean Patent Application No. 10-2020-0145366 filed on Nov. 3, 2020 in the Korean Intellectual Property Office, the disclosure of which is incorporated herein by reference in its entirety.

TECHNICAL FIELD

The present disclosure relates to a multilayer capacitor and a board having the same.

BACKGROUND

A multilayer capacitor has been widely used as an information technology (IT) component of a computer, a personal digital assistants (PDA), a cellular phone, and the like since it has a small size, implements high capacitance, and may be easily mounted, and has also been widely used as an electronic component since it has high reliability and high strength characteristics.

Recently, in accordance with miniaturization and multi-functionalization of electronic devices, multilayer capacitors have also been required to have a small size and high capacitance. To this end, a multilayer capacitor having a structure in which an area of internal electrodes in a width direction is significantly increased by exposing the internal electrodes in a width direction of a capacitor body has been manufactured.

In the multilayer capacitor having such a structure, after the capacitor body is manufactured and before the capacitor body is sintered, side portions are separately attached to opposite surfaces of the capacitor body in the width direction to cover the exposed portions of the internal electrodes.

However, in the multilayer capacitor having a structure in which the internal electrodes are exposed in the width direction of the capacitor body and the side portions are attached to the capacitor body as described above, a rate of occurrence of a short-circuit defect on a cut surface of the multilayer capacitor cut in the width direction may increase, and a problem such as a decrease in insulation resistance (IR) may thus occur.

SUMMARY

An aspect of the present disclosure may provide a multilayer capacitor in which capacitance may be increased, a rate of a short-circuit defect in a width direction of a capacitor body may be decreased, and a problem such as a decrease in insulation resistance may be decreased, and a board having the same.

According to an aspect of the present disclosure, a multilayer capacitor may include: a capacitor body including dielectric layers and first and second internal electrode layers and having first and second surfaces opposing each other, third and fourth surfaces connected to the first and second surfaces and opposing each other, and fifth and sixth surfaces connected to the first and second surfaces, connected to the third and fourth surfaces, and opposing each other, the first internal electrode layer contacting the third, fifth, and sixth surfaces, and the second internal electrode layer contacting the fourth, fifth, and sixth surfaces; and first and second external electrodes disposed on the third and fourth surfaces of the capacitor body, respectively. The first internal electrode layer may be divided into a 1-1-th internal electrode connected to the first external electrode and a 1-2-th internal electrode by a first space portion disposed at a position close to the sixth surface, and the second internal electrode layer may be divided into a 2-1-th internal electrode connected to the second external electrode and a 2-2-th internal electrode by a second space portion disposed at a position close to the fifth surface.

The multilayer capacitor may further include first and second side portions disposed on the fifth and sixth surfaces of the capacitor body, respectively.

The 1-1-th internal electrode may contact the third and fifth surfaces of the capacitor body, and the 2-1-th internal electrode may contact the fourth and sixth surfaces of the capacitor body.

The 1-2-th internal electrode may contact the sixth surface of the capacitor body and be spaced apart from the third surface of the capacitor body by the first space portion, and the 2-2-th internal electrode may contact the fifth surface of the capacitor body and be spaced apart from the fourth surface of the capacitor body by the second space portion.

The first space portion may include a 1-1-th space portion elongated in a direction towards the third and fourth surfaces and a 1-2-th space portion extending from an end portion of the 1-1-th space portion in a direction towards the fifth and sixth surfaces and contacting the sixth surface, and the second space portion may include a 2-1-th space portion elongated in the direction towards the third and fourth surfaces and a 2-2-th space portion extending from an end portion of the 2-1-th space portion in the direction towards the fifth and sixth surfaces and contacting the fifth surface.

The 1-1-th internal electrode may further include a first lead portion contacting the third and sixth surfaces, and the 2-1-th internal electrode may further include a second lead portion contacting the fourth and fifth surfaces.

The 1-1-th internal electrode may have a first cut-out portion disposed at a portion connecting the third surface and the fifth surface of the capacitor body to each other, and the 2-1-th internal electrode may have a second cut-out portion disposed at a portion connecting the fourth surface and the sixth surface of the capacitor body to each other.

The capacitor body may include an active region in which the first and second internal electrode layers overlap each other and upper and lower cover regions disposed on upper and lower surfaces of the active region, respectively.

The first and second external electrodes may include, respectively, first and second connection portions disposed on the third and fourth surfaces of the capacitor body, respectively, and connected to the 1-1-th internal electrode and the 2-1-th internal electrode, respectively; and first and second band portions extending from the first and second connection portions to parts of the first surface of the body, respectively.

According to another aspect of the present disclosure, a multilayer capacitor may include: a capacitor body including dielectric layers and first and second internal electrode layers and having first and second surfaces opposing each other, third and fourth surfaces connected to the first and second surfaces and opposing each other, and fifth and sixth surfaces connected to the first and second surfaces, connected to the third and fourth surfaces, and opposing each other, the first internal electrode layer contacting the third surface, and the second internal electrode layer contacting the fourth surface; and first and second external electrodes disposed on the third and fourth surfaces of the capacitor body, respectively. The first internal electrode layer may include a 1-1-th internal electrode disposed on one of the dielectric layers so as to contact the third and fifth surfaces of the capacitor body and connected to the first external electrode, and a 1-2-th internal electrode disposed on the one dielectric layer so as to be spaced apart from the 1-1-th internal electrode and the third surface and contact the sixth surface of the capacitor body, and the second internal electrode layer may include a 2-1-th internal electrode disposed on another of the dielectric layers so as to contact the fourth and sixth surfaces of the capacitor body and connected to the second external electrode, and a 2-2-th internal electrode disposed on the another dielectric layer so as to be spaced apart from the 2-1-th internal electrode and the fourth surface and contact the fifth surface of the capacitor body.

According to another aspect of the present disclosure, a board having a multilayer capacitor may include: a substrate having first and second electrode pads disposed on one surface thereof; and the multilayer capacitor as described above mounted on the substrate so that the first and second external electrodes are connected to the first and second electrode pads, respectively.

According to another aspect of the present disclosure, a multilayer capacitor may include: a capacitor body including dielectric layers and first and second internal electrode layers, and having first and second surfaces opposing each other, third and fourth surfaces connected to the first and second surfaces and opposing each other, and fifth and sixth surfaces connected to the first and second surfaces, connected to the third and fourth surfaces, and opposing each other; and first and second external electrodes disposed on the third and fourth surfaces of the capacitor body, respectively. The first internal electrode layer may include a 1-1-th internal electrode contacting the third and fifth surfaces and connected to the first external electrode, and a 1-2-th internal electrode contacting the sixth surface and spaced apart from the first and second external electrodes.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
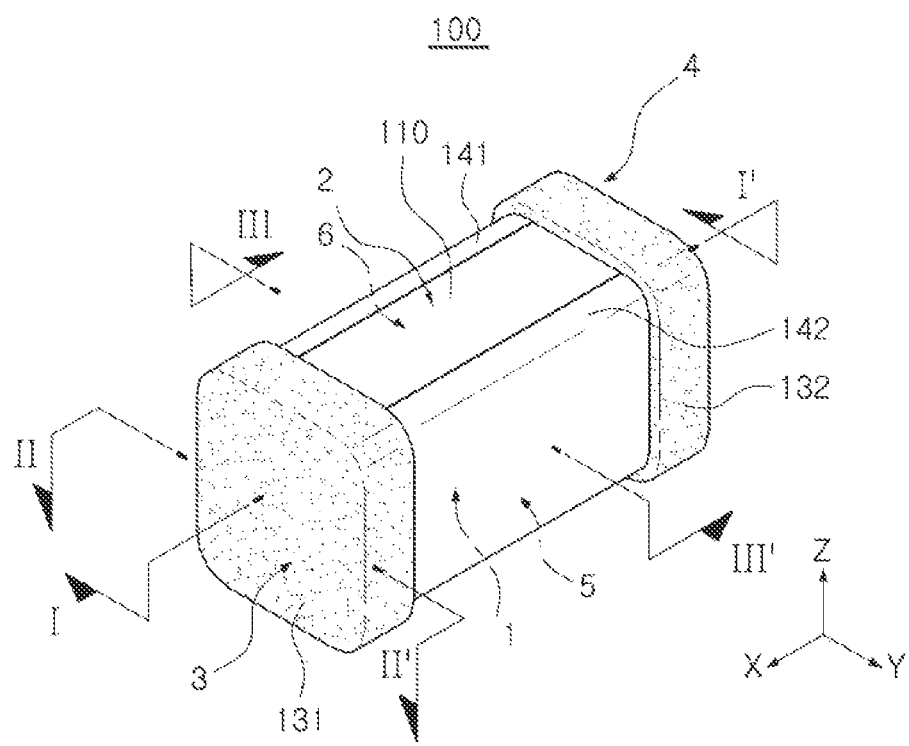
FIG. 1 is a perspective view illustrating a multilayer capacitor according to an exemplary embodiment in the present disclosure.

Hereinafter, exemplary embodiments of the present disclosure will now be described in detail with reference to the accompanying drawings.

Directions will be defined in order to clearly describe exemplary embodiments in the present disclosure. X, Y and Z in the drawings refer to a length direction, a width direction, and a thickness direction of a multilayer capacitor, respectively.

Here, the Z direction may be used as the same concept as a stacking direction in which dielectric layers are stacked in the present exemplary embodiment.

Figure 2:
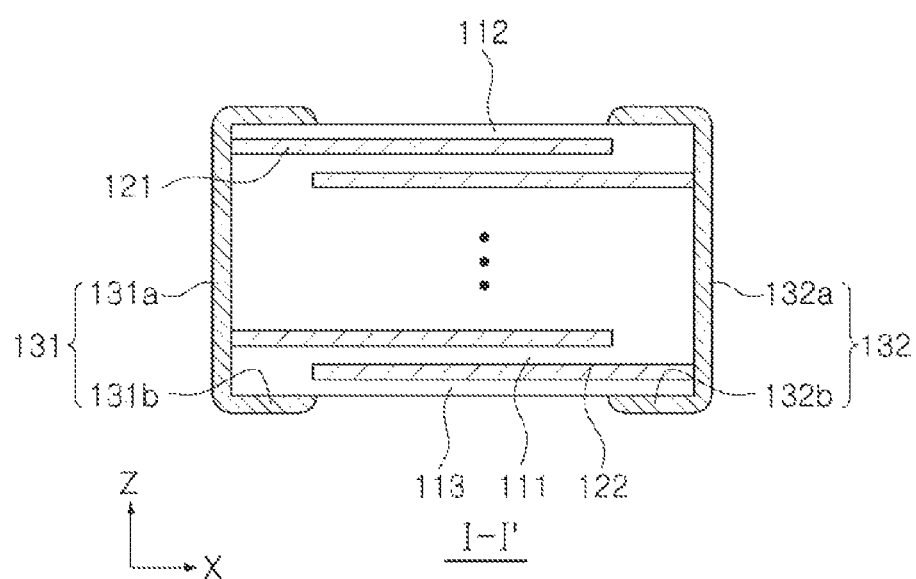
FIG. 2 is a cross-sectional view taken along line I-I' of FIG. 1.
Figure 3A:
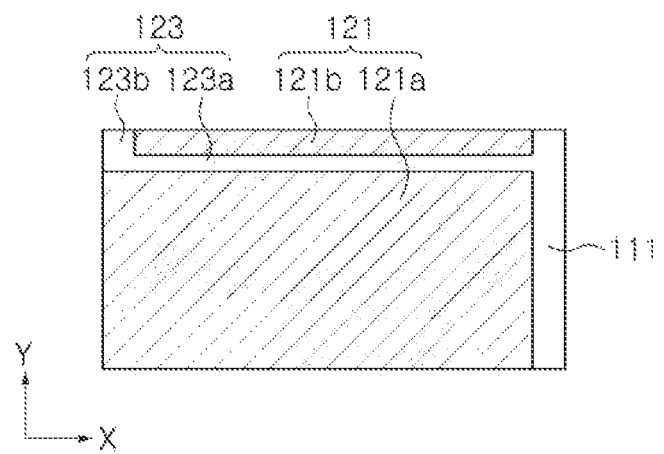
FIGS. 3A and 3B are plan views illustrating, respectively, first and second internal electrodes of the multilayer capacitor of FIG. 1.
Figure 3B:
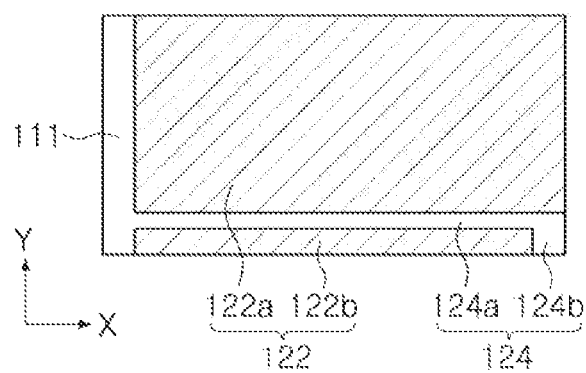
Figure 4:
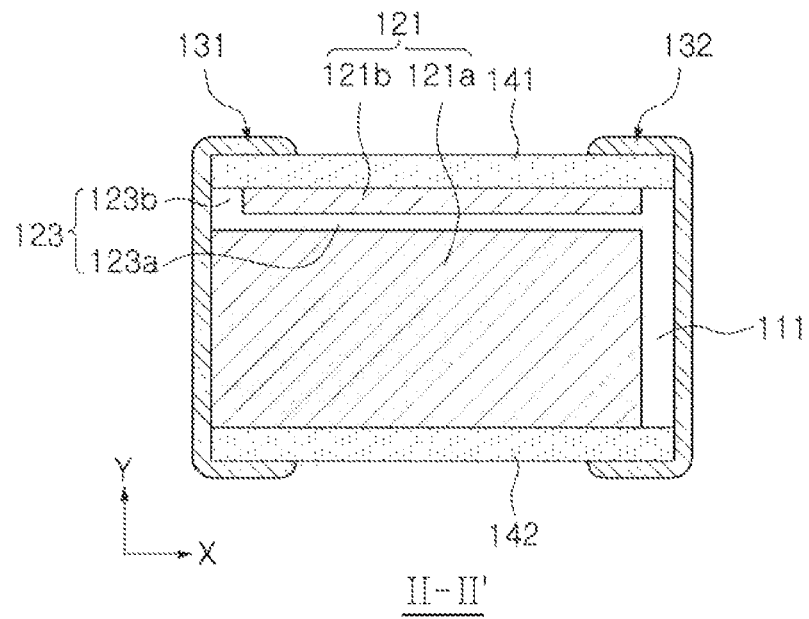
FIG. 4 is a cross-sectional view taken along line II-II' of FIG. 1.
Figure 5:
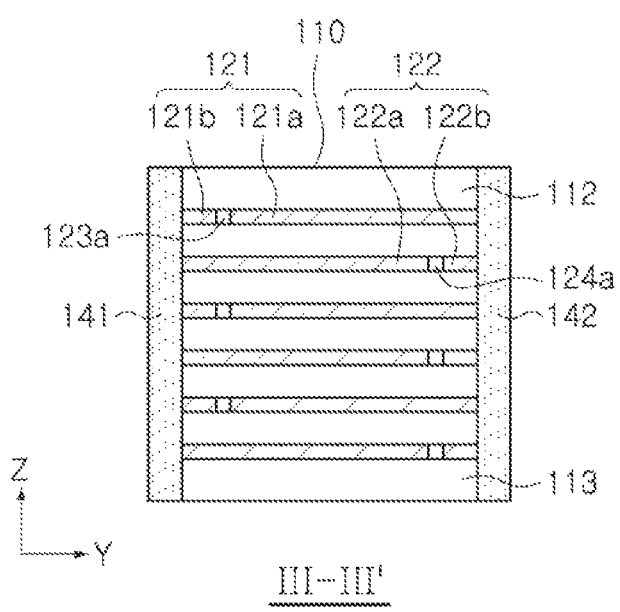
FIG. 5 is a cross-sectional view taken along line of FIG. 1.

FIG. 1 is a perspective view illustrating a multilayer capacitor according to an exemplary embodiment in the present disclosure, FIG. 2 is a cross-sectional view taken along line I-I' of FIG. 1, FIGS. 3A and 3B are plan views illustrating, respectively, first and second internal electrodes of the multilayer capacitor of FIG. 1, FIG. 4 is a cross-sectional view taken along line II-II' of FIG. 1, and FIG. 5 is a cross-sectional view taken along line III-III' of FIG. 1.

Hereinafter, a multilayer capacitor according to the present exemplary embodiment will be described with reference to FIGS. 1 through 5.

Referring to FIGS. 1 through 5, a multilayer capacitor 100 according to the present exemplary embodiment may include a capacitor body 110 and first and second external electrodes 131 and 132.

The capacitor body 110 may be formed by stacking and then sintering a plurality of dielectric layers 111 in the Z direction, and adjacent dielectric layers 111 of the capacitor body 110 may be integrated with each other so that boundaries therebetween are not readily apparent without using a scanning electron microscope (SEM).

In addition, the capacitor body 110 may include the plurality of dielectric layers 111 and first and second internal electrodes 121 and 122 (or first and second internal electrode layers 121 and 122) alternately disposed in the Z direction with each of the dielectric layers 111 interposed therebetween and having different polarities.

In addition, the capacitor body 110 may include an active region which contributes to forming capacitance of the multilayer capacitor and in which the first and second internal electrodes are alternately disposed in the Z direction with each of the dielectric layers 111 interposed therebetween and upper and lower cover regions 112 and 113 provided as margin portions on upper and lower surfaces of the active region in the Z direction, respectively.

A shape of the capacitor body 110 is not particularly limited, and may be a substantially hexahedral shape, and the capacitor body 110 may have first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other. In this case, in the present exemplary embodiment, the first surface 1 may be a mounted surface of the multilayer capacitor 100.

The dielectric layer 111 may include ceramic powder particles such as $BaTiO_3$-based ceramic powder particles or the like.

In addition, the $BaTiO_3$-based ceramic powder particles may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr or the like, is partially solid-dissolved in $BaTiO_3$, but are not limited thereto.

In addition, the dielectric layer 111 may further include a ceramic additive, an organic solvent, a plasticizer, a binder, a dispersant, and the like, in addition to the ceramic powder particles.

The ceramic additive may include, for example, a transition metal oxide or a transition metal carbide, a rare earth element, magnesium (Mg), aluminum (Al), or the like.

The first and second internal electrodes 121 and 122, which are electrodes having different polarities, may be formed on the respective dielectric layers 111 and be alternately stacked in the Z direction, and may be alternately disposed in the capacitor body 110 so as to face each other in the Z direction with each of the dielectric layers 111 interposed therebetween.

In this case, the first and second internal electrodes 121 and 122 may be electrically insulated from each other by each of the dielectric layers 111 disposed therebetween.

The first internal electrode 121 (or the first internal electrode layer 121) may be exposed through the third, fifth, and sixth surfaces 3, 5, and 6 of the capacitor body 110. In this case, the first internal electrode 121 (or the first internal electrode layer 121) may contact the third, fifth, and sixth surfaces 3, 5, and 6 of the capacitor body 110. In one example, the first internal electrode 121 may be spaced apart from the fourth surface 4 of the capacitor body 110.

In addition, the first internal electrode 121 may be divided into a 1-1-th internal electrode 121a and a 1-2-th internal electrode 121b by a first space portion 123 formed at a position close to the sixth surface 6 of the capacitor body 110 in the Y direction. For example, the first space portion 123 may be disposed to be closer to the sixth surface 6 of the capacitor body 110 than the fifth surface 5 of the capacitor body 110 in the Y direction.

The 1-1-th internal electrode 121a may be formed on the dielectric layer 111 so as to be exposed through the third and fifth surfaces 3 and 5 of the capacitor body 110. In this case, the 1-1-th internal electrode 121a may contact the third and fifth surfaces 3 and 5 of the capacitor body 110.

In addition, the 1-2-th internal electrode 121b may be formed on the dielectric layer 111 on which the 1-1-th internal electrode 121a is formed, so as to be exposed only through the sixth surface 6 of the capacitor body 110 in a state in which it is spaced apart from the 1-1-th internal electrode 121a in the Y direction by the first space portion 123. In this case, the 1-2-th internal electrode 121b may contact the sixth surface 6 of the capacitor body 110 in a state in which it is spaced apart from the 1-1-th internal electrode 121a in the Y direction by the first space portion 123. That is, the 1-2-th internal electrode 121b may be formed to be spaced apart from the third surface 3 of the capacitor body 110.

In addition, the first space portion 123 may include a 1-1-th space portion 123a formed to be elongated in the X direction and a 1-2-th space portion 123b extending from an end portion of the 1-1-th space portion 123a in the Y direction and exposed through the sixth surface 6 of the capacitor body 110. In this case, the 1-2-th space portion 123b may also be exposed through the third surface 3 of the capacitor body 110. The 1-2-th space portion 123b may contact the sixth surface 6 of the capacitor body 110, or contact both the sixth surface 6 and the third surface 3 of the capacitor body 110.

According to the present exemplary embodiment, since the 1-1-th internal electrode 121a and the 1-2-th internal electrode 121b are in a state where they are spaced apart from each other by the first space portion 123 and the 1-2-th internal electrode 121b is not connected to a first external electrode 131 to be described later, the sixth surface 6 of the capacitor body 110 which the 1-2-th internal electrode 121b contacts may be in an electrically opened state.

The second internal electrode 122 (or the second internal electrode layer 122) may be exposed through the fourth, fifth, and sixth surfaces 4, 5, and 6 of the capacitor body 110. That is, the second internal electrode 122 (or the second internal electrode layer 122) may contact the fourth, fifth, and sixth surfaces 4, 5, and 6 of the capacitor body 110. In one example, the first internal electrode 121 may be spaced apart from the third surface 3 of the capacitor body 110.

In addition, the second internal electrode 122 may be divided into a 2-1-th internal electrode 122a and a 2-2-th internal electrode 122b by a second space portion 124 formed at a position close to the fifth surface 5 of the capacitor body 110 in the Y direction. For example, the second space portion 124 may be disposed to be closer to the fifth surface 5 of the capacitor body 110 than the sixth surface 6 of the capacitor body 110 in the Y direction.

The 2-1-th internal electrode 122a may be formed on the dielectric layer 111 so as to be exposed through the fourth and sixth surfaces 4 and 6 of the capacitor body 110. The 2-1-th internal electrode 122a may contact the fourth and sixth surfaces 4 and 6 of the capacitor body 110.

In addition, the 2-2-th internal electrode 122b may be formed on the dielectric layer 111 on which the 2-1-th internal electrode 122a is formed, so as to be exposed only through the fifth surface 5 of the capacitor body 110 in a state in which it is spaced apart from the 2-1-th internal electrode 122a in the Y direction by the second space portion 124. That is, the 2-2-th internal electrode 122b may contact the fifth surface 5 of the capacitor body 110 in a state in which it is spaced apart from the 2-1-th internal electrode 122a in the Y direction by the second space portion 124. That is, the 2-2-th internal electrode 122b may be formed to be spaced apart from the fourth surface 4 of the capacitor body 110.

In addition, the second space portion 124 may include a 2-1-th space portion 124a formed to be elongated in the X direction and a 2-2-th space portion 124b extending from an end portion of the 2-1-th space portion 124a in the Y direction and exposed through the fifth surface 5 of the capacitor body 110. In this case, the 2-2-th space portion 124b may also be exposed through the fourth surface 4 of the capacitor body 110. The 2-2-th space portion 124b may contact the fifth surface 5 of the capacitor body 110, or contact both the fifth surface 5 and the fourth surface 4 of the capacitor body 110.

According to the present exemplary embodiment, since the 2-1-th internal electrode 122a and the 2-2-th internal electrode 122b are in a state where they are spaced apart from each other by the second space portion 124 and the 2-2-th internal electrode 122b is not connected to a second external electrode 132 to be described later, the fifth surface 5 of the capacitor body 110 which the 2-2-th internal electrode 122b contacts may be in an electrically opened state.

In this case, an end portion of the 1-1-th internal electrode 121a of the first internal electrode 121 contacting the third surface 3 of the capacitor body 110 and an end portion of the 2-1-th internal electrode 122a of the second internal electrode 122 contacting the fourth surface 4 of the capacitor body 110 may be electrically connected, respectively, to the first and second external electrodes 131 and 132 disposed, respectively, on opposite end surfaces of a capacitor body 100 to be described below in the X direction.

According to the configuration as described above, when predetermined voltages are applied to the first and second external electrodes 131 and 132, electric charges may be accumulated between the first and second internal electrodes 121 and 122.

In this case, capacitance of the multilayer capacitor 100 may be in proportion to an area of the first and second internal electrodes 121 and 122 overlapping each other along the Z direction in the active region.

When the first and second internal electrodes 121 and 122 are configured as in the present exemplary embodiment, basic areas of the first and second internal electrodes 121 and 122 may be increased, but an area of the first and second internal electrodes 121 and 122 vertically overlapping each other may also be increased, and capacitance of the multilayer capacitor 100 may thus be increased.

That is, when an area of a region in which the first and second internal electrodes 121 and 122 overlap each other is significantly increased, capacitance may be significantly increased even in a multilayer capacitor having the same size.

In addition, an acceleration life of insulation resistance may be improved by decreasing steps due to the stacking of the internal electrodes, such that the multilayer capacitor 100 having excellent capacitance characteristics and improved reliability may be provided.

In addition, since the fifth and sixth surfaces 5 and 6 of the capacitor body 110 are in the electrically opened state, a problem that parts of the first and second internal electrodes 121 and 122 may cause an electrical defect by coming into contact with second and first internal electrodes 122 and 121 positioned above and below the first and second internal electrodes 121 and 122 in the Z direction and having different polarities while flowing down in a process of cutting a laminate into each chip after stacking the plurality of dielectric layers 111 on which the internal electrodes are formed, may be decreased.

In this case, a material of each of the first and second internal electrodes 121 and 122 is not particularly limited, and may be a conductive paste formed of one or more of a noble metal material, or nickel (Ni) and copper (Cu).

A method of printing the conductive paste may be a screen printing method, a gravure printing method or the like, but is not limited thereto.

The multilayer capacitor 100 according to the present exemplary embodiment may further include first and second side portions 141 and 142.

The first side portion 141 may be disposed on the fifth surface 5 of the capacitor body 110, and the second side portion 142 may be disposed on the sixth surface 6 of the capacitor body 110. In one example, the first side portion 141 and the dielectric layers 111 of the capacitor body 110 may have a boundary therebetween not readily apparent without using a scanning electron microscope (SEM), and the second side portion 141 and the dielectric layers 111 of the capacitor body 110 may have a boundary therebetween not readily apparent without using SEM, although the present disclosure is not limited thereto.

The first and second side portions 141 and 142 may be in contact with the fifth and sixth surfaces 5 and 6 of the capacitor body 110, respectively, so as to cover front ends of portions of the first internal electrodes 121 and 122 contacting the fifth and sixth surfaces 5 and 6 of the capacitor body 110, respectively.

The first and second side portions 141 and 142 may serve to protect the capacitor body 110 and the first and second internal electrodes 121 and 122 from external impacts or the like and secure an insulation property and moisture resistance reliability around the capacitor body 110.

Voltages having different polarities may be provided to the first and second external electrodes 131 and 132, respectively, and the first and second external electrodes 131 and 132 may be disposed on the opposite end surfaces of the capacitor body 110 in the X direction, respectively, and may be electrically connected to portions of the 1-1-th and 2-1-th internal electrodes 121a and 122a contacting the third and fourth surfaces 3 and 4 of the capacitor body 110, respectively.

The first external electrode 131 may include a first connection portion 131a and a first band portion 131b.

The first connection portion 131a may be disposed on the third surface 3 of the capacitor body 110, and may be in contact with the end portions of the 1-1-th internal electrodes 121a externally contacting the third surface 3 of the capacitor body 110 to serve to physically and electrically connect the 1-1-th internal electrodes 121a and the first external electrode 131 to each other.

The first band portion 131b may extend from the first connection portion 131a to a part of the first surface 1 of the capacitor body 110.

In this case, the first band portion 131b may further extend toward the second, fifth, and sixth surfaces 2, 5, and 6 of the capacitor body 110 in order to improve fixing strength, if necessary, to cover one end portions of the first and second side portions 141 and 142.

The second external electrode 132 may include a second connection portion 132a and a second band portion 132b.

The second connection portion 132a may be disposed on the fourth surface 4 of the capacitor body 110, and may be in contact with the end portions of the 2-1-th internal electrodes 122a externally contacting the fourth surface 4 of the capacitor body 110 to serve to physically and electrically connect the 2-1-th internal electrodes 122a and the second external electrode 132 to each other.

The second band portion 132b may extend from the first connection portion 132a to a part of the first surface 1 of the capacitor body 110.

In this case, the second band portion 132b may further extend toward the second, fifth, and sixth surfaces 2, 5, and 6 of the capacitor body 110 in order to improve fixing strength, if necessary, to cover the other end portions of the first and second side portions 141 and 142.

In addition, each of the first and second external electrodes 131 and 132 may include a plating layer in order to improve at least some of structural reliability, ease in mounting the multilayer capacitor on a board, durability and heat resistance against external sources, and equivalent series resistance (ESR).

For example, the plating layer may be formed by sputtering or electric deposition, but is not limited thereto.

In addition, the plating layer may contain nickel most abundantly, but is not limited thereto, and may be formed of copper (Cu), palladium (Pd), platinum (Pt), gold (Au), silver (Ag), or lead (Pb), or alloys thereof.

Since the multilayer capacitor 100 according to the present exemplary embodiment has a structure in which the first and second internal electrodes 121 and 122 are contacting the fifth and sixth surfaces 5 and 6 of the capacitor body 110, respectively, steps of the capacitor body 110 at end portions of the first and second internal electrodes 121 and 122 in the Y direction may be decreased.

Therefore, even though thicknesses of the dielectric layers 111 and the first and second internal electrodes 121 and 122 are decreased to make the multilayer capacitor 100 multilayer and thin, a significant problem may not occur in reliability of the multilayer capacitor 100, and both of an increase in capacitance of the multilayer capacitor 100 and securing of the reliability of the multilayer capacitor 100 may thus be achieved.

In addition, in a multilayer capacitor according to the related art having a structure in which the internal electrodes are exposed to opposite surfaces of the capacitor body in the width direction, short-circuit defects on the fifth and sixth surfaces of the capacitor body may be significantly increased as compared with a multilayer capacitor having a structure in which the internal electrodes are not exposed in the width direction of the capacitor body.

Before the side portions are attached to the fifth and sixth surfaces of the capacitor body, an additional process such as a process of cleaning the fifth and sixth surfaces of the capacitor body may be required.

In addition, such a short-circuit defect may cause a decrease in insulation resistance of the multilayer capacitor.

In the present exemplary embodiment, since the fifth and sixth surfaces 5 and 6 of the capacitor body 110 are in the electrically opened state, even though parts of the first and second internal electrodes 121 and 122 come into contact with second and first internal electrodes 122 and 121 having different polarities while flowing down through the fifth and sixth surfaces 5 and 6 of the capacitor body 110 in a process of cutting a laminate into each chip after stacking the plurality of dielectric layers 111 on which the internal electrodes are formed, a short circuit may not occur, such that reliability of the multilayer capacitor 100 may be improved.

When a short-circuit defect rate of the multilayer capacitor 100 is reduced as described above, a problem such as the decrease in the insulation resistance of the multilayer capacitor 100 may also be solved.

Figure 8:
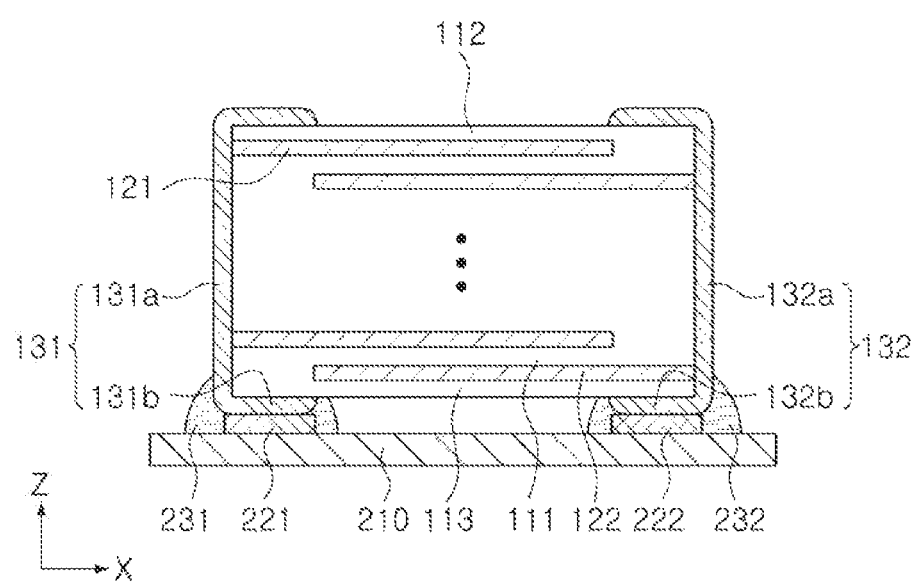
FIG. 8 is a cross-sectional view illustrating a board on which the multilayer capacitor of FIG. 1 is mounted.

Referring to FIG. 8, a board having a multilayer capacitor according to the present exemplary embodiment may include a substrate 210 having first and second electrode pads 211 and 222 disposed on one surface thereof and the multilayer electronic capacitor 100 mounted on an upper surface of the substrate 210 so that the first and second external electrodes 131 and 132 thereof are connected to the first and second electrode pads 221 and 222, respectively.

It has been illustrated and described in the present exemplary embodiment that the multilayer capacitor 100 is mounted on the substrate 210 by solders 231 and 232, but conductive pastes may be used instead of the solders, if necessary.

Experimental Example

Hereinafter, an experiment for comparing capacitances and breakdown voltages (BDVs) of a multilayer capacitor according to the present disclosure and a multilayer capacitor according to the related art with each other was performed, and experiment results were illustrated in FIG. 9.

Comparative Examples are multilayer capacitors having a length of 1.440 mm and a width of 0.797 mm and including first and second internal electrodes contacting both of fifth and sixth surfaces of a capacitor body. In Comparative Examples, a space portion is not included in each of the first and second internal electrodes, and each of the first and second internal electrode is one integral electrode.

Inventive Examples are multilayer capacitors having the same size as Comparative Examples, and including first and second internal electrodes having the structure illustrated in FIGS. 3A and 3B.

Here, the BDV was confirmed by measuring a voltage at which a short circuit occurs while increasing a voltage applied to the multilayer capacitor from 0 V to the voltage at which the short circuit occurs.

Figure 9:
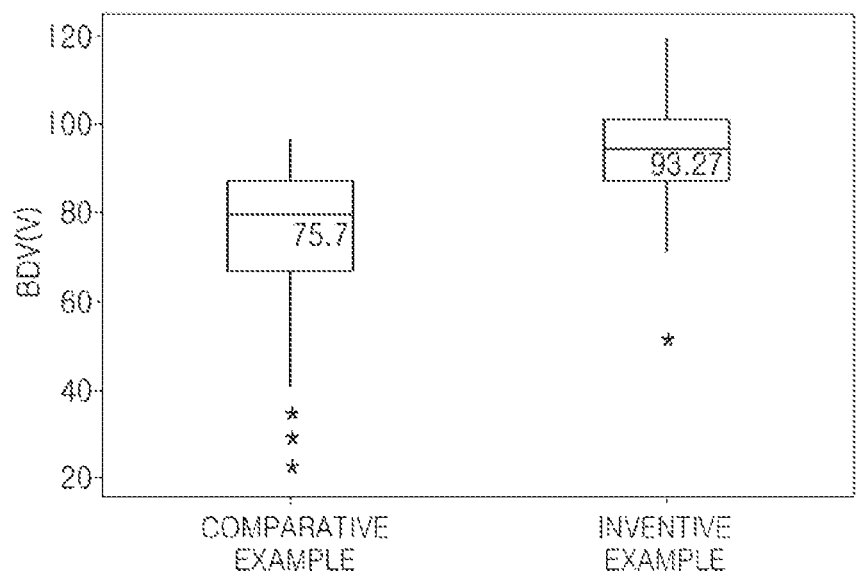
FIG. 9 is graphs for comparing breakdown voltages (BDVs) of Comparative Example and Inventive Example with each other.

Referring to FIG. 9, an average BDV of Comparative Examples was 75.7 V, and an average BDV of Inventive Example was 93.27 V, which was increased by 20.6 V as compared with Comparative Examples. In addition, a percentage of Comparative Examples of which BDVs are 80 V or less was about 50%, and a percentage of Inventive Examples of which BDVs are 80 V or less was about 7%. Therefore, it may be considered that Inventive Examples have a more robust design structure than Comparative Examples.

Here, with respect to a short-circuit rate, it was confirmed whether or not a short circuit has occurred by measuring a resistant value when a predetermined current and voltage are applied to each type.

Figure 10:
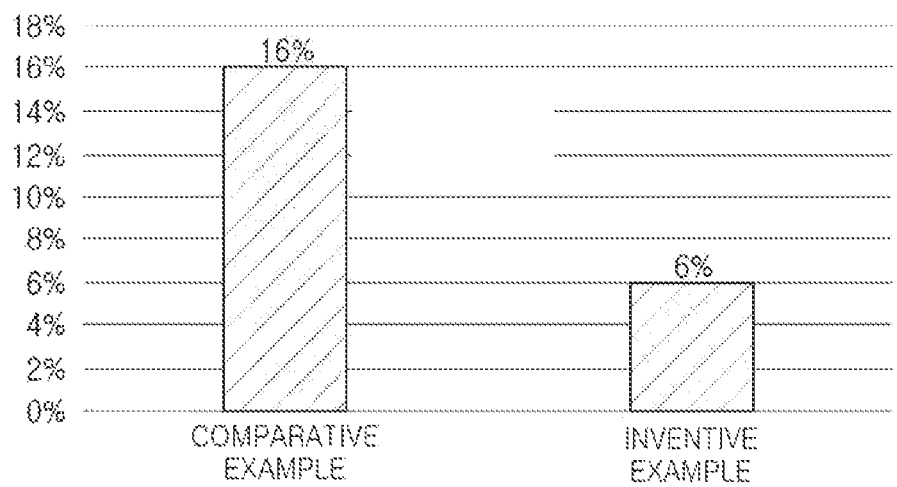
FIG. 10 is graphs for comparing short-circuit rates of Comparative Example and Inventive Example with each other.

Referring to FIG. 10, a short-circuit rate of Comparative Example was 16% and a short-circuit rate of Inventive Example was 6%. Therefore, it may be seen that the short-circuit rate of Inventive Example was decreased by 62.5% as compared with Comparative Example. Therefore, it may be seen that reliability of the multilayer capacitor according to Inventive Example is excellent.

The present disclosure is not limited by the exemplary embodiment described above and the accompanying drawings, and is to be limited by the appended claims.

Therefore, various types of substitutions, modifications, and alterations may be made by those skilled in the art without departing from the spirit and scope of the prevent disclosure defined by the claims, and these substitutions, modifications, and alterations will be considered to fall with the scope of the present disclosure.

Figure 6A:
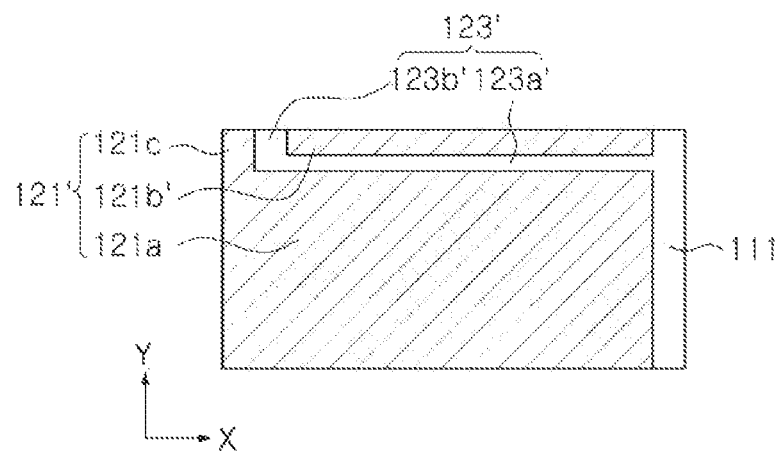
FIGS. 6A and 6B are plan views illustrating, respectively, first and second internal electrodes according to another exemplary embodiment.

For example, as illustrated in FIG. 6A, a 1-1-th internal electrode 121a of a first internal electrode 121' may further include a first lead portion 121c extending from a position close to the sixth surface 6 of the capacitor body 110 on the dielectric layer 111 so as to be exposed through the third and sixth surfaces 3 and 6 of the capacitor body 110. That is, the first lead portion 121c may contact the third and sixth surfaces 3 and 6 of the capacitor body 110.

In this case, the first lead portion 121c may also contact a corner portion connecting the third and sixth surfaces 3 and 6 of the capacitor body 110 to each other.

Figure 6B:
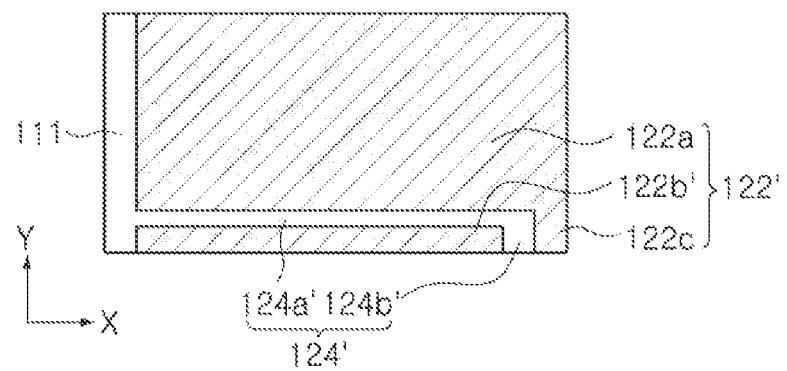

In addition, as illustrated in FIG. 6B, a 2-1-th internal electrode 122a of a second internal electrode 122' may further include a second lead portion 122c extending from a position close to the fifth surface 5 of the capacitor body 110 on the dielectric layer 111 so as to be exposed through the fourth and fifth surfaces 4 and 5 of the capacitor body 110. That is, the second lead portion 122c may contact the fourth and fifth surfaces 4 and 5 of the capacitor body 110.

In this case, the second lead portion 122c may also contact a corner portion connecting the fourth and fifth surfaces 4 and 5 of the capacitor body 110 to each other.

Since a short-circuit occurrence probability is relatively low at positions of the fifth and sixth faces 5 and 6 of the capacitor body 110 adjacent to the third and fourth faces 3 and 4 of the capacitor body 110, electrical connectivity between the internal electrodes and the external electrodes may be further improved without significantly increasing a short-circuit occurrence probability, by such a structure.

Figure 7A:
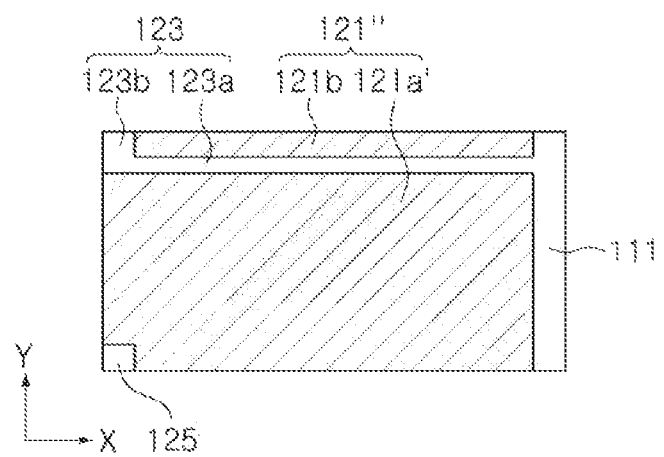
FIGS. 7A and 7B are plan views illustrating, respectively, first and second internal electrodes according to another exemplary embodiment.

In addition, as illustrated in FIG. 7A, a 1-1-th internal electrode 121a' of a first internal electrode 121" may have a first cut-out portion 125 formed at a portion connecting the third surface 3 and the fifth surface 5 of the capacitor body 110 to each other.

In this case, the first cut-out portion 125 may be formed at a corner portion connecting the third surface 3 and the fifth surface 5 of the capacitor body 110 to each other.

Figure 7B:
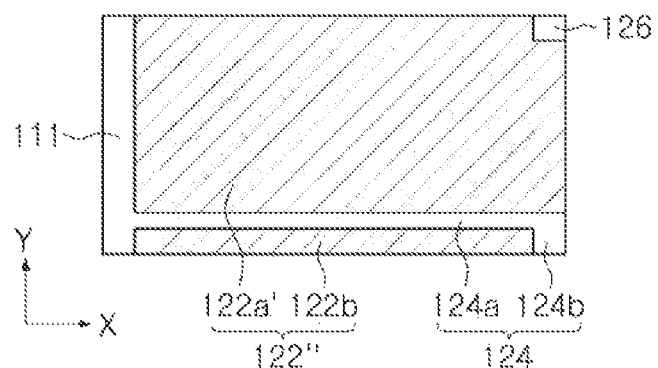

In addition, as illustrated in FIG. 7B, a 2-1-th internal electrode 122a' of a second internal electrode 122" may have a second cut-out portion 126 formed at a portion connecting the fourth surface 4 and the sixth surface 6 of the capacitor body 110 to each other.

In this case, the second cut-out portion 126 may be formed at a corner portion connecting the fourth surface 4 and the sixth surface 6 of the capacitor body 110 to each other.

The first and second cut-out portions 125 and 126 may further improve moisture resistance reliability of the multilayer capacitor.

As set forth above, according to an exemplary embodiment in the present disclosure, capacitance of the multilayer capacitor may be increased by extending the internal electrodes so as to be exposed through and contact surfaces in the width direction of the capacitor body, and the short-circuit defect and the problem such as the decrease in the insulation resistance occurring on a cut surface of the multilayer capacitor in the width direction may be decreased by electrically opening opposite surfaces of the capacitor body in the width direction.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
   a capacitor body including dielectric layers and first and second internal electrode layers stacked in a stacking direction and having first and second surfaces opposing each other in the stacking direction, third and fourth surfaces connected to the first and second surfaces and opposing each other, and fifth and sixth surfaces connected to the first and second surfaces, connected to the third and fourth surfaces, and opposing each other, the first internal electrode layer contacting the third, fifth, and sixth surfaces, and the second internal electrode layer contacting the fourth, fifth, and sixth surfaces; and
   first and second external electrodes disposed on the third and fourth surfaces of the capacitor body, respectively,
   wherein the first internal electrode layer is divided into a 1-1-th internal electrode connected to the first external electrode and a 1-2-th internal electrode by a first space portion disposed at a position close to the sixth surface,
   the second internal electrode layer is divided into a 2-1-th internal electrode connected to the second external electrode and a 2-2-th internal electrode by a second space portion disposed at a position close to the fifth surface,
   the 1-1-th internal electrode overlaps the 2-2-th internal electrode in the stacking direction, and the 2-1-th internal electrode overlaps the 1-2-th internal electrode in the stacking direction,
   the 1-1-th internal electrode is in contact with the third and fifth surfaces and is spaced apart from the sixth surface,
   the 1-2-th internal electrode is in contact with the sixth surface and is spaced apart from the third surface of the capacitor body by the first space portion,
   the 2-1-th internal electrode is in contact with the fourth and sixth surfaces and is spaced apart from the fifth surface, and
   the 2-2-th internal electrode is in contact with the fifth surface and is spaced apart from the fourth surface of the capacitor body by the second space portion.

2. The multilayer capacitor of claim 1, further comprising first and second side portions disposed on the fifth and sixth surfaces of the capacitor body, respectively.

3. The multilayer capacitor of claim 1, wherein the first space portion includes a 1-1-th space portion elongated in a direction towards the third and fourth surfaces and a 1-2-th space portion extending from an end portion of the 1-1-th space portion in a direction towards the fifth and sixth surfaces and contacting the sixth surface, and
   the second space portion includes a 2-1-th space portion elongated in the direction towards the third and fourth surfaces and a 2-2-th space portion extending from an end portion of the 2-1-th space portion in the direction towards the fifth and sixth surfaces and contacting the fifth surface.

4. The multilayer capacitor of claim 1, wherein the 1-1-th internal electrode has a first cut-out portion disposed at a portion connecting the third surface and the fifth surface of the capacitor body to each other, and
   the 2-1-th internal electrode has a second cut-out portion disposed at a portion connecting the fourth surface and the sixth surface of the capacitor body to each other.

5. The multilayer capacitor of claim 1, wherein the capacitor body includes an active region in which the first and second internal electrode layers overlap each other and upper and lower cover regions disposed on upper and lower surfaces of the active region, respectively.

6. The multilayer capacitor of claim 1, wherein the first and second external electrodes include, respectively,
   first and second connection portions disposed on the third and fourth surfaces of the capacitor body, respectively, and connected to the 1-1-th internal electrode and the 2-1-th internal electrode, respectively; and
   first and second band portions extending from the first and second connection portions to parts of the first surface of the body, respectively.

7. A board having a multilayer capacitor, comprising:
   a substrate having first and second electrode pads disposed on one surface thereof; and
   the multilayer capacitor of claim 1 mounted on the substrate so that the first and second external electrodes are connected to the first and second electrode pads, respectively.

* * * * *